United States Patent
Fang et al.

(10) Patent No.: US 12,114,524 B2
(45) Date of Patent: Oct. 8, 2024

(54) DISPLAY PANEL AND DISPLAY DEVICE

(71) Applicant: KunShan Go-Visionox Opto-Electronics Co., Ltd, Jiangsu (CN)

(72) Inventors: Xuyang Fang, Kunshan (CN); Chao Chi Peng, Kunshan (CN); Mingxing Liu, Kunshan (CN); Shizhen Feng, Kunshan (CN); Panpan Wang, Kunshan (CN); Zhiyuan Zhang, Kunshan (CN); Shuaiyan Gan, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 427 days.

(21) Appl. No.: 17/732,981

(22) Filed: Apr. 29, 2022

(65) Prior Publication Data
US 2022/0255047 A1 Aug. 11, 2022

Related U.S. Application Data

(63) Continuation of application No. PCT/CN2021/083370, filed on Mar. 26, 2021.

(30) Foreign Application Priority Data

May 8, 2020 (CN) .......................... 202010382256.9

(51) Int. Cl.
*H01L 31/0232* (2014.01)
*H01L 27/146* (2006.01)
(Continued)

(52) U.S. Cl.
CPC ....... *H10K 50/86* (2023.02); *H01L 27/14625* (2013.01); *H01L 31/02327* (2013.01); *H10K 50/844* (2023.02); *H10K 59/124* (2023.02)

(58) Field of Classification Search
CPC .... H10K 50/86; H10K 50/844; H10K 59/124; H10K 59/50; H10K 59/87;
(Continued)

(56) References Cited

U.S. PATENT DOCUMENTS 9,385,170 B2 * 7/2016 Jeon ...................... H10K 59/126
10,185,092 B1 * 1/2019 Bian ...................... G02B 6/305
(Continued)

FOREIGN PATENT DOCUMENTS

CN 102738196 A 10/2012
CN 109196524 A 1/2019
(Continued)

OTHER PUBLICATIONS

Office Action issued Jun. 2, 2022 in Chinese Patent Application No. 202010382256.9 (with English translation); 10 pgs.
(Continued)

*Primary Examiner* — Eduardo A Rodela
(74) *Attorney, Agent, or Firm* — Maier & Maier, PLLC

(57) ABSTRACT

A display panel and a display device, where the display panel includes a substrate, an insulation layer, a conductive layer, a first planarization layer, an OLED layer and an encapsulation layer which are stacked in sequence, where a plurality of first grooves are formed in the conductive layer, and the first planarization layer fills the first grooves and covers the conductive layer; the display panel further includes a compensation layer, where a plurality of second grooves are formed in the compensation layer, and projection of the compensation layer on the substrate at least overlaps with projection of part of the first grooves on the substrate.

18 Claims, 7 Drawing Sheets

(51) Int. Cl.
   *H10K 50/844* (2023.01)
   *H10K 50/86* (2023.01)
   *H10K 59/124* (2023.01)

(58) Field of Classification Search
   CPC ............. H10K 59/8722; H10K 59/873; H10K 59/8731; H10K 59/875; H10K 59/879; H10K 59/8791
   See application file for complete search history.

(56) References Cited

U.S. PATENT DOCUMENTS

| | | | | |
|---|---|---|---|---|
| 10,811,474 | B2* | 10/2020 | Cha | H10K 59/871 |
| 11,125,806 | B2* | 9/2021 | Tinnemans | G03F 7/706839 |
| 11,187,960 | B2* | 11/2021 | Gao | G02B 6/0026 |
| 11,243,350 | B2* | 2/2022 | Bian | G02B 6/124 |
| 11,397,357 | B2* | 7/2022 | Wang | G02F 1/1334 |
| 2011/0228181 | A1* | 9/2011 | Jeong | H04N 13/356 359/463 |
| 2012/0104367 | A1 | 5/2012 | Hasegawa et al. | |
| 2014/0321493 | A1* | 10/2014 | Matsumoto | H01L 21/02507 372/50.11 |
| 2017/0205547 | A1* | 7/2017 | Lochbihler | G02B 5/1809 |
| 2021/0334509 | A1* | 10/2021 | Yang | G06V 40/1324 |
| 2022/0036810 | A1* | 2/2022 | Gu | H10K 59/131 |
| 2022/0123264 | A1* | 4/2022 | Choi | H10K 59/875 |

FOREIGN PATENT DOCUMENTS

| | | |
|---|---|---|
| CN | 110061014 A | 7/2019 |
| CN | 110520863 A | 11/2019 |
| CN | 110634930 A | 12/2019 |
| CN | 110767673 A | 2/2020 |
| CN | 110767714 A | 2/2020 |
| CN | 110911438 A | 3/2020 |
| CN | 111477668 A | 7/2020 |

OTHER PUBLICATIONS

International Search Report mailed Jun. 24, 2021, in corresponding to International Application No. PCT/CN2021/083370; 6 pages (with English Translation).

* cited by examiner

DISPLAY PANEL AND DISPLAY DEVICE

CROSS-REFERENCE TO RELATED APPLICATIONS

The present application is a continuation of International Application No. PCT/CN2021/083370, filed on Mar. 26, 2021, which claims priority to Chinese Patent Application No. CN 202010382256.9, filed on May 8, 2020. The disclosures of the aforementioned applications are incorporated in the present application by reference.

TECHNICAL FIELD

The present application relates to the field of display technology, and in particular, to a display panel and a display device.

BACKGROUND

With the development of the display technology, an area ratio of the display screen to an electronic apparatus, also referred to as a screen-to-body ratio, is getting higher and higher, and the electronic apparatus with a high screen-to-body ratio can bring people a better visual experience. Taking mobile phones as an example, full-screen mobile phones, that is, mobile phones with a screen-to-body ratio of 100%, have become more and more popular in recent years. At present, a display panel has been widely used in portable electronic apparatus. For example, it may be used in a mobile phone, a tablet, an e-book and a navigation apparatus. Organic Light-Emitting Diodes (abbreviation: OLEDs) are gradually applied to the display panel due to their advantages of low power consumption, high color saturation, wide viewing angle, thin thickness and available flexibility.

FIG. 1 is a structural diagram of a display panel in the prior art. as shown in FIG. 1, the display panel includes a substrate 100, an insulation layer 200, a conductive layer 310, a first planarization layer 320, an OLED layer 400 and an encapsulation layer 500, which are sequentially stacked, The conductive layer 310 is formed with grooves by etching, so that the OLED layer 400 located above can emit light after being powered on. In order to achieve a full screen of the mobile phone, a front camera needs to be hidden under the screen, that is, the camera is located under the display panel (that is, the camera is disposed under the substrate), and light needs to pass through the entire display panel before it can be captured by the camera.

With the above solution, when light passes through the display panel, the diffraction is likely to occur at the conductive layer 310 with grooves, thereby affecting the final imaging quality.

SUMMARY

In view of this, embodiments of the present application provides a display panel and a display device, and the display panel of the present application may reduce the phenomenon of diffraction when light passes through the display panel, thereby facilitating to improve the imaging quality of an under-screen camera.

An embodiment of the present application provides a display panel, including a substrate, an insulation layer, a conductive layer, a first planarization layer, an OLED layer and an encapsulation layer which are stacked in sequence, where a plurality of first grooves are formed in the conductive layer, and the first planarization layer fills the first grooves and covers the conductive layer; further including a compensation layer, where a plurality of second grooves are formed in the compensation layer, projection of the compensation layer on the substrate at least shading projection of part of the first grooves on the substrate.

The display panel according to this embodiment includes a compensation layer, second grooves are formed in the compensation layer, and the projection of the compensation layer on the substrate may overlap with the projection of part of the first grooves on the substrate. That is, in this embodiment, the projection of the compensation layer on the substrate has an area less than or equal to that of the projection of the first grooves on the substrate. Due to the existence of the compensation layer, the difference in the phase and the amplitude of light passing through various parts of the display panel is reduced, thereby reducing the occurrence of the phenomenon diffraction, which is beneficial to improve an imaging quality of the under-screen camera.

For the display panel described above, optionally, the projection of the compensation layer on the substrate coincides with the projection of the first grooves on the substrate.

In this embodiment, by means of forming the projection of the compensation layer on the substrate and the projection of the first grooves on the substrate into complementary shapes, the difference in the phase and the amplitude of light passing through various parts of the display panel may be further reduced, the occurrence of the light diffraction phenomenon is further lowered, and the imaging quality of the under-screen camera is improved.

For the display panel described above, optionally, the compensation layer and the conductive layer are made same material.

When the compensation layer and the conductive layer are made of same material, the compensation layer may simultaneously compensate the difference in amplitude and phase of light passing through the whole conductive layer, thereby reducing occurrence of the light diffraction phenomenon.

For the display panel described above, optionally, the compensation layer has a thickness equal to that of the conductive layer.

Further, when the compensation layer has a thickness equal to that of the conductive layer, since the two layers are made of the same material, the compensation layer may completely compensate the difference in amplitude and phase of light passing through the whole conductive layer, so that the occurrence of the light diffraction phenomenon may be theoretically eliminated.

For the display panel described above, optionally, the compensation layer and the conductive layer are made from different materials, the compensation layer includes a first compensation layer and a second compensation layer which are provided in a stacked manner, the first compensation layer is configured to compensate an amplitude, and the second compensation layer is configured to compensate a phase.

When the compensation layer and the conductive layer are made of different materials, the first compensation layer for compensating the amplitude and the second compensation layer for compensating the phase may be separately provided, so as to compensate the difference in amplitude and phase of light passing through the whole conductive layer, thereby reducing the occurrence of the diffraction phenomenon.

For the display panel described above, optionally, the compensation layer is detachably provided on the encapsulation layer.

By detachably providing the compensation layer on the encapsulation layer, it may be convenient for the replacement and detachment of the compensation layer, and facilitate to adjust the parameters such as the thickness of the compensation layer according to the actual situation, so as to better reduce the occurrence of the diffraction phenomenon Another embodiment of the present application provides a display device, including any one of the display panel described above.

The display device according to an exemplary embodiment of the present application may reduce the probability of the light diffraction occurring when light passes through the display panel, thereby facilitating to improve the imaging quality of the under-screen camera.

BRIEF DESCRIPTION OF DRAWINGS

In order to more clearly illustrate technical solutions of embodiments of the present application or the prior art, drawings that need to be used in the description of the embodiments or the prior art will be briefly introduced in the following. Obviously, the drawings in the following description are some embodiments of the present application, and for those ordinary skilled in the art, other drawings may also be obtained according to these drawings without creative work.

DETAILED DESCRIPTION OF THE EMBODIMENTS

In order to make the purposes, technical solutions and advantages of embodiments of the present application clearer, the technical solutions in the embodiments of the present application will be clearly and completely described below in conjunction with the drawings in the embodiments of the present application. Obviously, the described embodiments are part of the embodiments of the present application, but not all of the embodiments.

Based on the embodiments in the present application, all other embodiments obtained by those ordinary skilled in the art without creative work are within the scope of protection of the present application. In the absence of conflict, the embodiments and features in the embodiments described below may be combined with each other.

Figure 1:
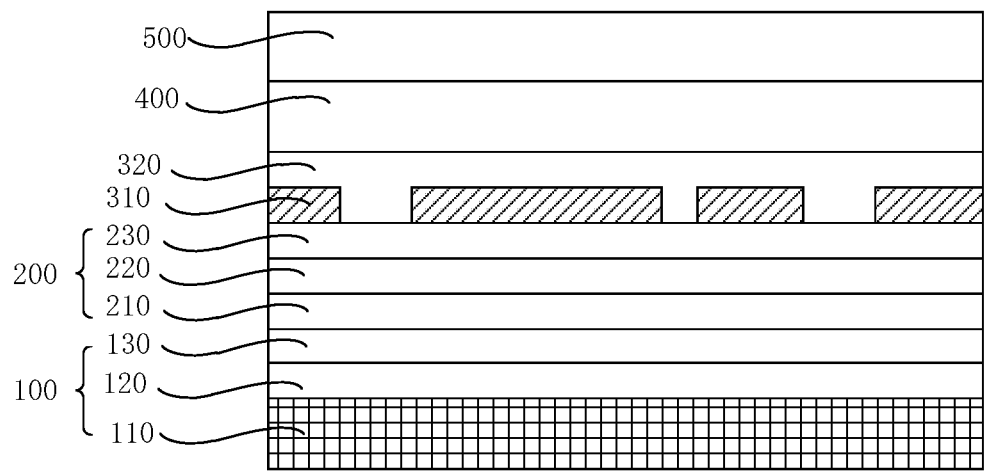
FIG. 1 is a structural diagram of a display panel in the prior art.

FIG. 1 is a structural diagram of a display panel in the prior art; as shown in FIG. 1, the display panel includes a substrate 100, an insulation layer 200, a conductive layer 310, a first planarization layer 320, an OLED layer 400 and an encapsulation layer 500 which are stacked in sequence. The conductive layer 310 is formed with grooves by etching, thereby lighting the OLED layer 400 located above after being powered on. In order to achieve a full screen of a mobile phone, a front camera needs to be hidden under the screen, that is, the camera is located under the display panel (that is, the camera is disposed under the substrate 100), and when a picture is taken, light needs to pass through the entire display panel before it can be captured by the camera.

Figure 7:
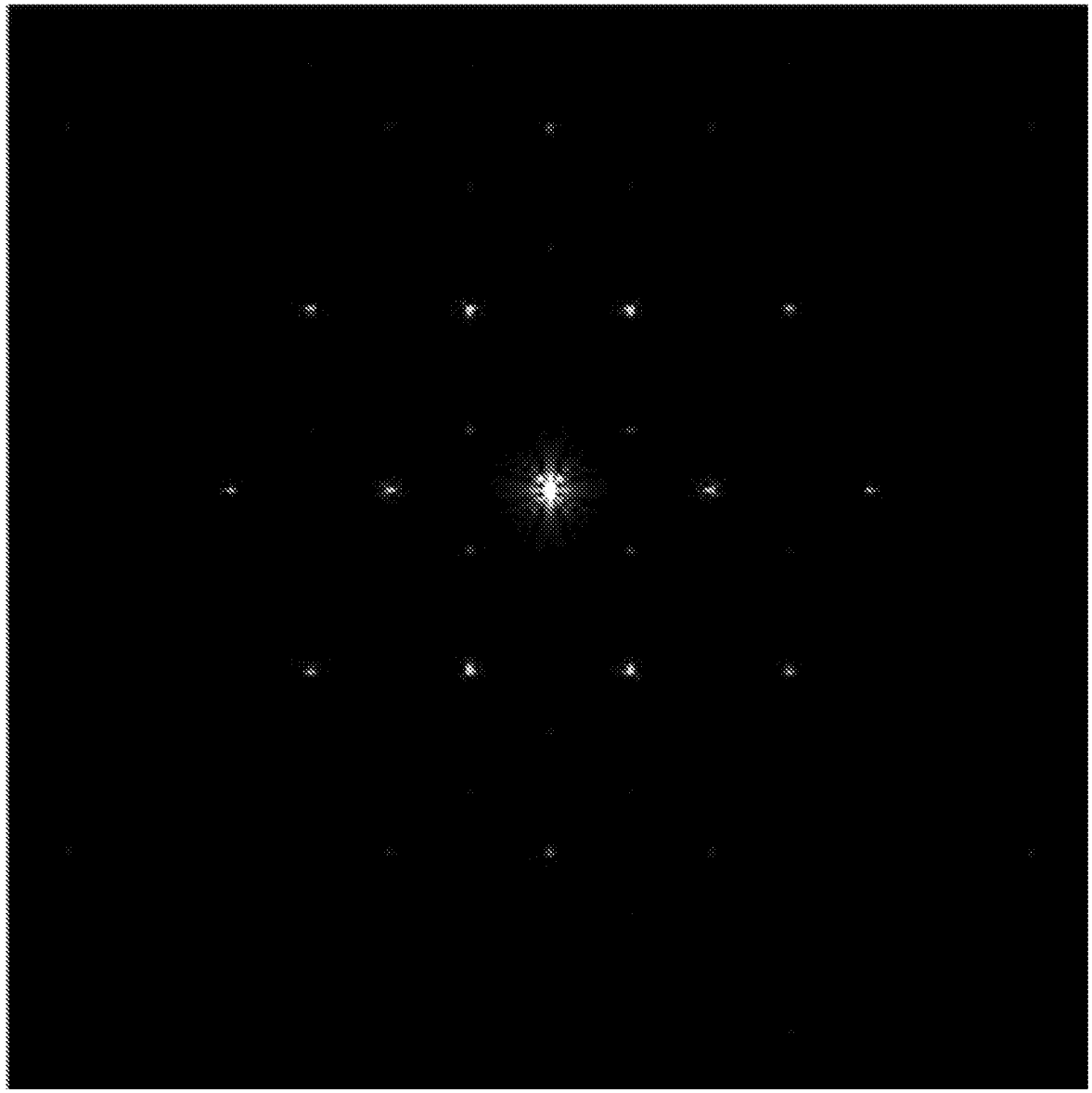
FIG. 7 is a diagram of a diffraction situation of a display panel in the prior art.

With this arrangement, when light passes through the display panel, the phase and the amplitude of light after passing through positions with grooves are different from those of light after passing through positions without grooves, so that light is prone to diffraction at the conductive layer 310 with the grooves, thereby affecting the final imaging quality. FIG. 7 is a diagram of a diffraction situation of a display panel in the prior art. As shown in FIG. 7, when light passes through the display panel, a diffraction phenomenon occurs at the conductive layer 310 with the grooves, causing a plurality of diffraction light spots around the camera, thereby greatly affecting the imaging quality.

In view of this, embodiments of the present application aims to provide a display panel and a display device, the display panel has a compensation layer formed by a patterning process, including steps of exposure, development, etching, etc., and the compensation layer may be provided between any two layers in the display panel. The pattern of the compensation layer and the pattern of the conductive layer form a complementary structure, that is, the pattern of the compensation layer may fill gaps formed by the grooves in the conductive layer, thereby compensating for the phase and the amplitude of light passing through positions with the grooves and making them close to the phase and the amplitude of light passing through positions without the grooves, so that a purpose of reducing or eliminating the occurrence of the diffraction phenomenon when light passes through the display panel is achieved, which contributes to improving the imaging quality of the under-screen camera.

The contents of the present application will be described in detail below in combination with the drawings, so that those skilled in the art can understand the contents of the present application in more detail.

Figure 2A:
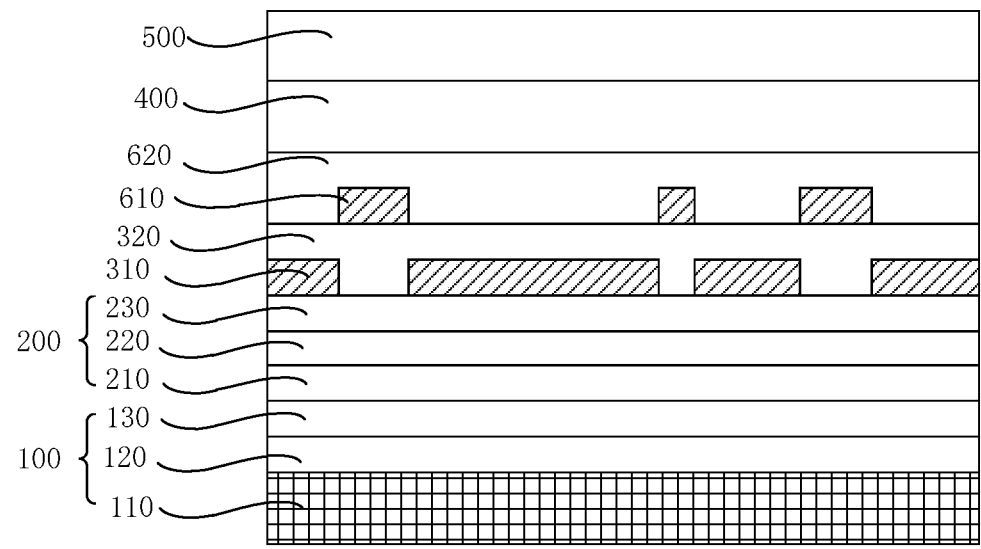
FIG. 2(a)-FIG. 2(b) are structural diagrams of display panels according to an embodiment of the present application.
Figure 2B:
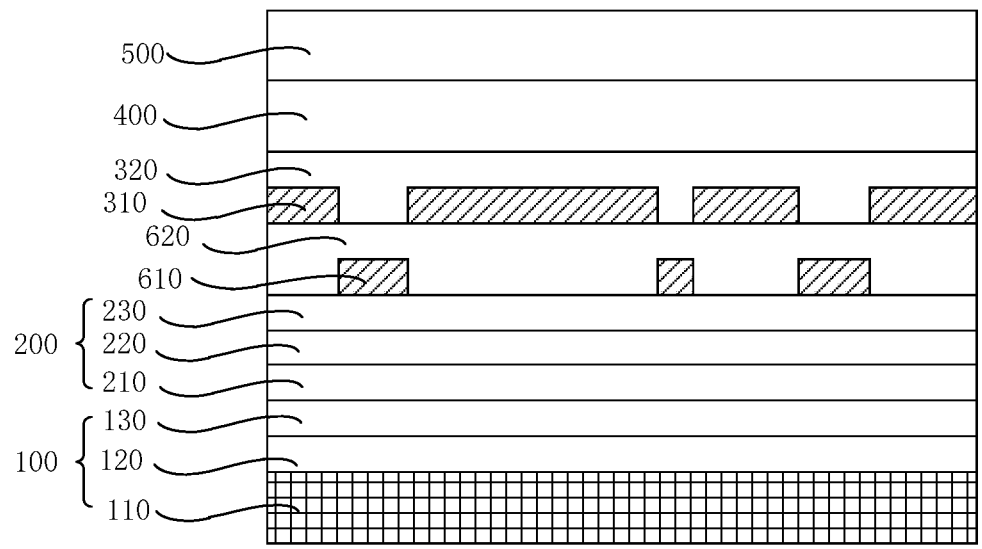

FIG. 2(a) and FIG. 2(b) are structural diagrams of display panels according to an embodiment of the present application, please refer to FIG. 2(a)-FIG. 2(b). This embodiment provides a display panel, including substrate 100, an insulation layer 200, a conductive layer 310, a first planarization layer 320, an OLED layer 400 and an encapsulation layer 500 which are sequentially stacked. A plurality of first grooves are formed in the conductive layer 310, and the first planarization layer 320 fills the first grooves and covers the conductive layer 310.

A compensation layer 610 is further included, a plurality of second grooves are formed in the compensation layer 610, and the projection of the compensation layer 610 on the substrate 100 at least shields the projection of part of the first grooves on the substrate 100.

Specifically, the display panel of this embodiment is arranged above the under-screen camera in an electronic apparatus, that is, the display panel of this embodiment includes a photographing region on a display screen, which may be called a display region along with other regions on the display screen other than the photographing region. It should be noted that in order to realize the full screen function, the photographing region of the display panel still has a normal function of display.

In this embodiment, the substrate 100 includes a base 110, a first substrate insulation layer 120 and a second substrate insulation layer 130 which are formed in a stacked manner. The base 110 may be selected from a flexible base or a rigid base, and when the flexible base 110 is selected, the display screen may have good bending property; the first substrate insulation layer 120 and the second substrate insulation layer 130 may be selected from materials such as silicon oxide, silicon nitride or silicon oxynitride etc., and the material of the first substrate insulation layer 120 is different from that of the second substrate insulation layer 130.

The insulation layer 200 includes a gate insulation layer 210, a capacitor insulation layer 220, and an interlayer dielectric layer 230. The structure of such parts corresponds to a structure between two adjacent metal layers in the display region. It should be noted that, in order to avoid the influence of excessive metal layers in the display region on light transmittance, in this embodiment, metal layers in the traditional display region are removed, and a layer of novel conductive layer 310 is disposed above the insulation layer 200 instead, and the newly provided conductive layer 310 is configured to light the OLED layer 400. In order to improve light transmittance, the conductive layer 310 is made of a material with a higher light transmittance, such as indium tin oxide, etc.

In order to realize the lighting of upper OLED layer 400 by the conductive layer 310, the conductive layer 310 needs to be patterned to form a plurality of first grooves, so that the conductive layer 310 can conduct current. Then, the first planarization layer 320 fills the first grooves, and is located on the conductive layer 310 to cover a portion of the conductive layer 310, so that the top of the conductive layer 310 is flat, which facilitates the subsequent fabrication of the OLED layer 400 and the encapsulation layer 500.

Due to the existence of the first grooves in the conductive layer 310, the phase and the amplitude of light after passing the positions on the display panel with the first grooves are significantly different from those of light after passing through the positions on the display panel without the first grooves. In addition, the first grooves form structures like slits or small holes on the conductive layer 310. The diffraction phenomenon is prone to occur when light passes through such structures, which affects the final light quality.

In view of this, in this embodiment, a compensation layer 610 is further included in the display panel. The compensation layer 610 is also a layer formed through a patterning process. A plurality of second grooves are formed in the compensation layer 610, the projection of the compensation layer 610 on the substrate 100 at least overlaps with the projection of part of the first grooves on the substrate 100, that is, the projection of the compensation layer 610 on the substrate 100 may fill gaps of the projection of a portion of the conductive layer 310 on the substrate 100, so that the phase and the amplitude of light after passing through various parts of the display panel tend to be identical, which reduces the occurrence of the light diffraction phenomenon when light passes through the conductive layer 310, and contributes to improving the imaging quality of the under-screen camera.

Optionally, in order to facilitate the fabrication of the subsequent layers, a second planarization layer 620 may also be included. The second planarization layer 620 fills the second grooves and covers the compensation layer 610, so that the top of the compensation layer 610 is flat, which facilitates the fabrication of subsequent layers.

Specifically, in this embodiment, as shown in FIG. 2(a), the compensation layer 610 may be disposed between the first planarization layer 320 and the OLED layer 400; or, as shown in FIG. 2(b), the compensation layer 610 may be disposed between the insulation layer 200 and the conductive layer 310.

In the actual production, for the structure corresponding to FIG. 2(a), the compensation layer 610 that is patterned may be formed after the first planarization layer 320 is formed, that is, the compensation layer 610 is formed above the first planarization layer 320 by processes of exposure, development, etching, etc., and then the second planarization layer 620 fills the compensation layer 610 to ensure the preparation of the subsequent layers. For the structure corresponding to FIG. 2(b), the compensation layer 610 that is patterned may be formed after the insulation layer 200 is formed, that is, the compensation layer 610 is formed above the insulation layer 200 by processes of exposure, development and etching, etc., and then the second planarization layer 620 fills the compensation layer 610 to ensure the preparation of the subsequent layers.

According to the above description, the projection of the compensation layer 610 on the substrate 100 in this embodiment may overlaps with the projection of part of the first grooves on the substrate 100, that is, an area of the projection of the compensation layer 610 is less than or equal to an area of the projection of the first grooves on the substrate 100. Due to the existence of the compensation layer 610, the difference in the phase and the amplitude of light passing through various parts of the display panel is reduced, thereby reducing the phenomenon of the diffraction that occurs when light passes through the display panel, and facilitating to improve the imaging quality of the under-screen camera.

In this embodiment, the projection of the compensation layer 610 on the substrate 100 completely coincides with the projection of the first grooves on the substrate 100.

By means of forming the projection of the compensation layer 610 on the substrate 100 and the projection of the first grooves on the substrate 100 into complementary shapes, the difference in the phase and the amplitude when light passes through the display panel may be further reduced, the occurrence of the light diffraction phenomenon when light passes through the display panel may be further reduced, and the imaging quality of the under-screen camera is improved.

In this embodiment, the compensation layer 610 may be selected from a silicon oxide layer, a silicon nitride layer, a silicon oxynitride layer, a single crystal silicon layer or an indium tin oxide layer, etc., that is, there is no need to deliberately require the material of the compensation layer 610 to be the same as that of the conductive layer 310, as long as the compensation function for the amplitude and phase of the light passed can be achieved.

In an optional implementation, the material of the compensation layer 610 is the same as that of the conductive layer 310, for example, both are made of indium tin oxide.

When the material of the compensation layer 610 is the same as the material of the conductive layer 310, the compensation layer 610 may simultaneously compensate the differences in amplitude and phase when light passes through the first grooves and the conductive layer 310, thereby reducing occurrence of the diffraction phenomenon.

On the basis of the above implementation, a thickness of the compensation layer 610 may be equal to a thickness of the conductive layer 310.

When the thickness of the compensation layer 610 is equal to the thickness of the conductive layer 310, since the materials of the two layers are the same, the compensation layer 610 may completely compensate the differences in amplitude and phase when light passes through the whole conductive layer 310, so that the occurrence of the diffraction phenomenon may theoretically be eliminated.

Figure 9:
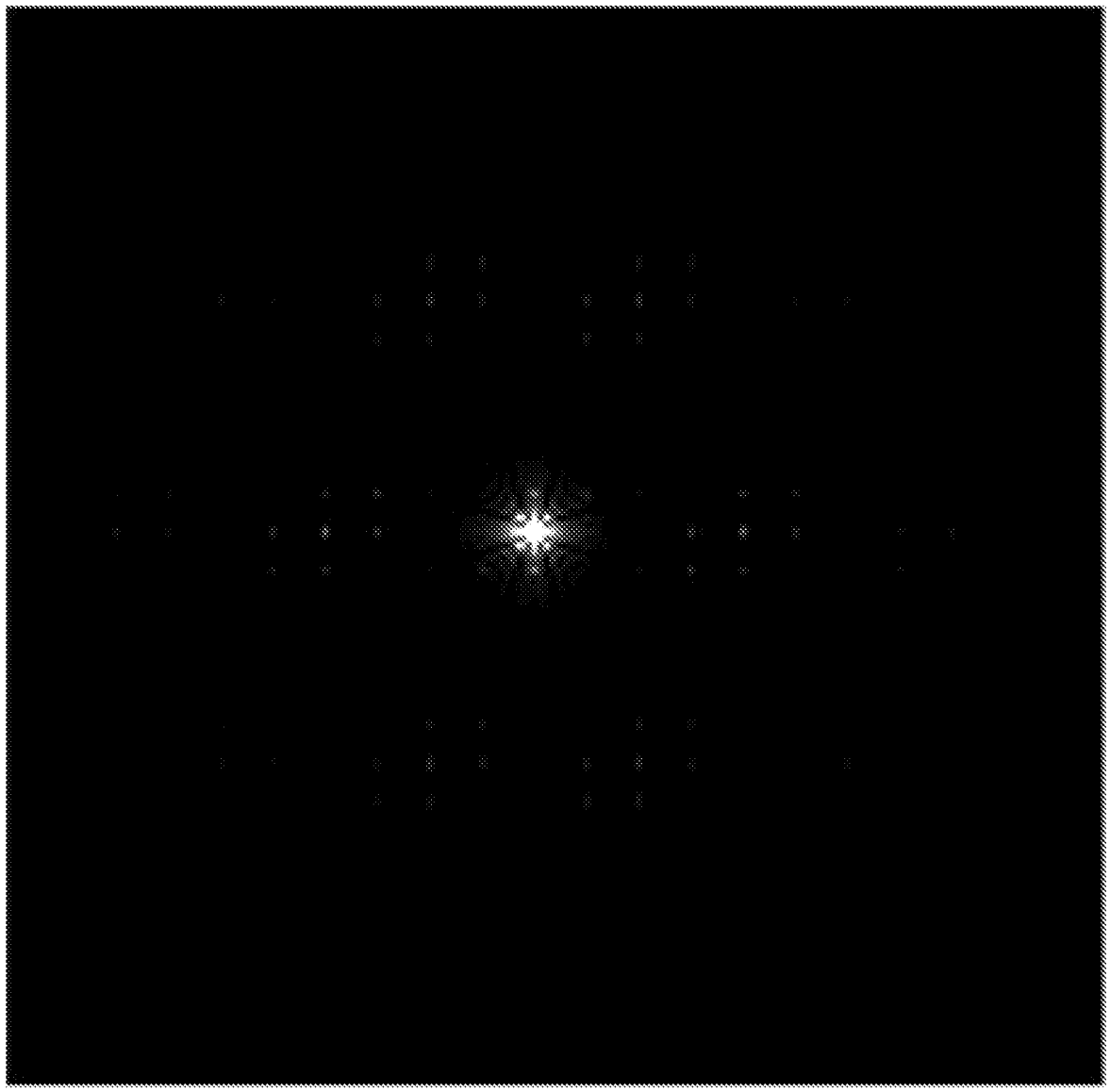
FIG. 9 is a diagram of a diffraction situation of a display panel according to another embodiment of the present application.

FIG. 9 is a diagram of a diffraction situation of a display panel according to another embodiment of the present application; please refer to FIG. 9. The diffraction situation of light passing through the display panel is shown in FIG. 9, where the compensation layer 610 is made of the indium tin oxide, As can be seen from FIG. 9, when compared with FIG. 7, after light passes through the display panel, the diffracted light spots distributed around the camera are substantially eliminated, that is, the diffraction phenomenon is substantially eliminated, which is beneficial to improve the imaging quality of the under-screen camera.

In another optional implementation, the material of the compensation layer 610 and the material of the conductive layer 310 may be different. In this case, the compensation layer 610 includes a first compensation layer and a second compensation layer which are stacked, and the first compensation layer is configured to compensate the amplitude, the second compensation layer is configured to compensate the phase.

When the material of the compensation layer 610 and the material of the conductive layer 310 are different, the first compensation layer for compensating the amplitude and the second compensation layer for compensating the phase may be separately provided, so as to compensate differences in amplitude and phase when light passes through the first grooves and the whole conductive layer 310, thereby reducing the occurrence of the diffraction phenomenon.

Specifically, the difference in the amplitudes of light passing through various parts of the display panel may be adjusted by using the first compensation layer, so that the amplitudes of light passing through various parts of the display panel are the same. Further, the thickness of the first compensation layer and the thickness of the second compensation layer may be controlled based on the difference in refractive indexes of the materials, so that the optical path of light passing through the first compensation layer and the second compensation layer is the same as the optical path of light passing through portions of the conductive layer 310 without the first grooves, thereby the phases of light after passing through various parts of the display panel being identical. Through the above solution, the compensation for the amplitude and the phase is achieved, so that the phase and the amplitude of light passing through various parts of the display panel are substantially consistent, which reduces the occurrence of the diffraction phenomenon.

It should be noted that, the first compensation layer for compensating the amplitude in this embodiment may be a multilayer which is formed in stacked manner. During production, the first compensation layer may be firstly prepared to adjust the amplitude of light after passing through the display panel. Next, the second compensation layer is prepared, so that the optical path of light after passing through the first compensation layer and second compensation layer is the same as the optical path of light after passing through portions of the conductive layer 310 without the first grooves, thereby making the phases of light after passing through various parts of the display panel same. Since the phases and the amplitudes of light after passing through various parts of the display panel are substantially consistent, the occurrence of the diffraction phenomenon is reduced.

Figure 8:
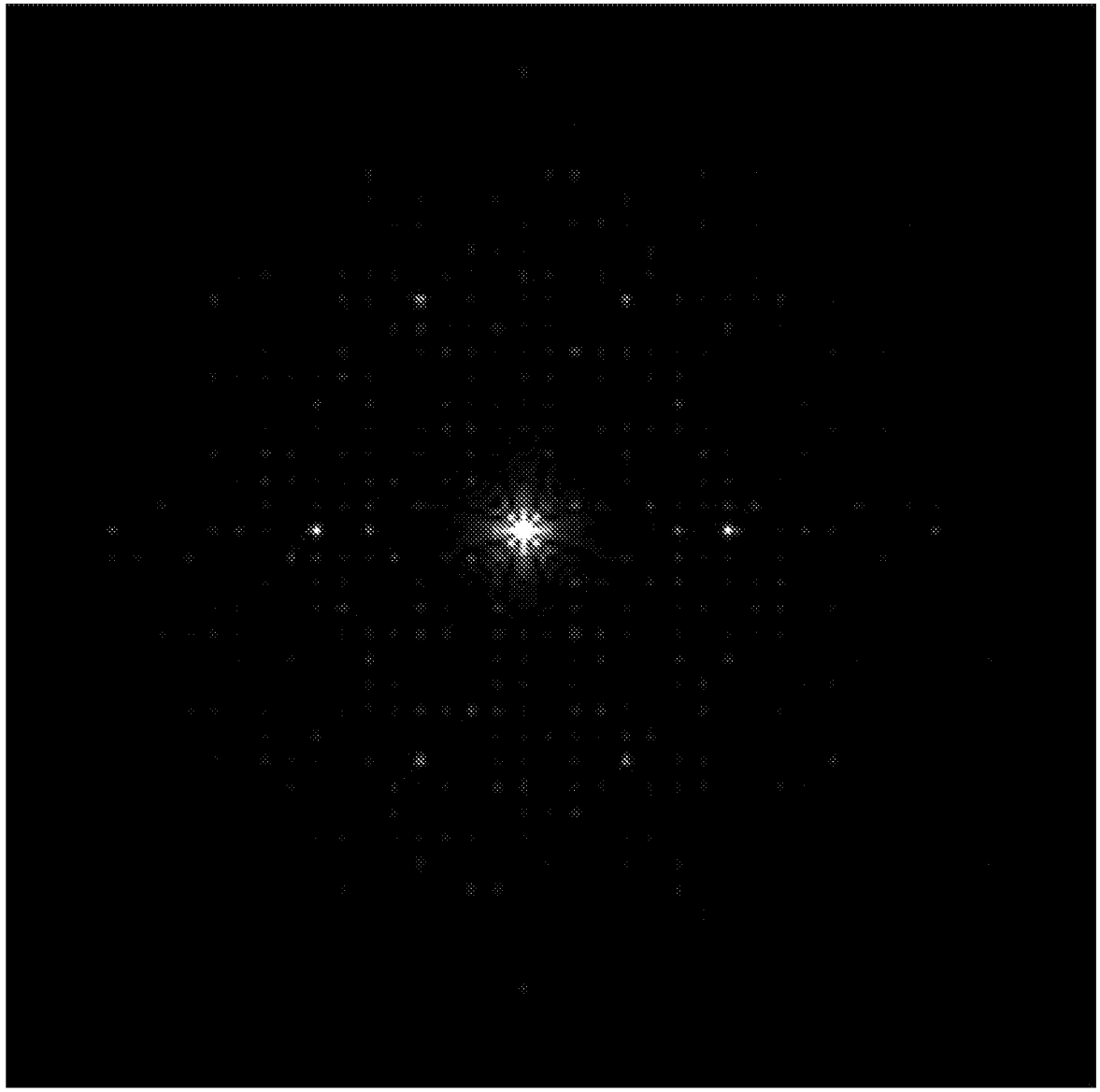
FIG. 8 is a diagram of a diffraction situation of a display panel according to an embodiment of the present application.

FIG. 8 is a diagram of a diffraction situation of a display panel according to an embodiment of the present application; please refer to FIG. 8. The diffraction situation of light passing through the display panel is shown in FIG. 8, the compensation layer 610 being made of a silicon oxide, where the silicon oxide layer is used to compensate the phase. As can be seen from FIG. 8, when compared with FIG. 7, after light passes through the display panel, the diffracted light spots distributed around the camera are significantly reduced, that is, the diffraction phenomenon is significantly reduced, which is beneficial to improve the imaging quality of the under-screen camera.

Figure 3:
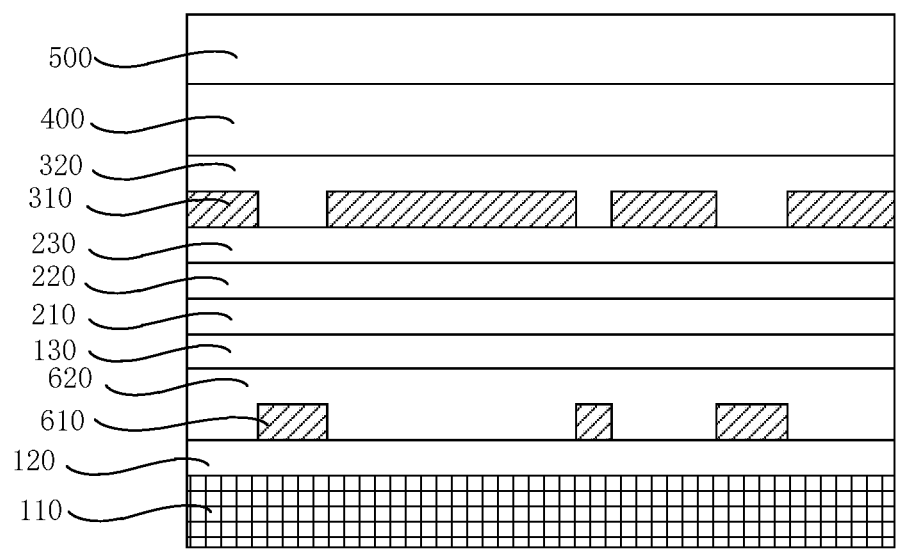
FIG. 3 is a structural diagram of a display panel according to another embodiment of the present application, with a compensation layer being provided within a substrate.

FIG. 3 is a structural diagram of a display panel according to another embodiment of the present application; please refer to FIG. 3. The display panel according to this embodiment includes a substrate 100, an insulation layer 200, a conductive layer 310, a first planarization layer 320, an OLED layer 400 and an encapsulation layer 500 which are sequentially stacked. A plurality of first grooves are formed in the conductive layer 310, and the first planarization layer 320 fills the first grooves and covers the conductive layer 310.

A compensation layer 610 is further included, a plurality of second grooves are formed in the compensation layer 610, and the projection of the compensation layer 610 on the substrate 100 at least overlaps with the projection of part of the first grooves on the substrate 100.

This embodiment is different from the above embodiments in that the compensation layer 610 in this embodiment is provided in the substrate 100. As shown in FIG. 3, the compensation layer 610 in this embodiment is provided between the first substrate insulation layer 120 and the second substrate insulation layer 130 within the substrate 100. Since the compensation layer 610 and the conductive layer 310 are still provided on the same side of the under-screen camera, that is, on the same light propagation path, this embodiment may also achieve the purpose in the above embodiments of reducing the diffraction phenomenon of light and improving the imaging quality.

It should be noted that this embodiment only shows the solution in which the compensation layer 610 is located between the first substrate insulation layer 120 and the second substrate insulation layer 130. It is clear for those skilled in the art that, in other optional implementations, the compensation layer 610 may also be provided between the base 110 and the first substrate insulation layer 120 or between the second substrate insulation layer 130 and the upper insulation layer 200, both of the two arrangement manners still being able to achieve the same effects.

Optionally, in this embodiment, a second planarization layer 620 may be further provided on the compensation layer 610, so that a surface of the compensation layer 610 is flatter, which facilitates the fabrication of subsequent layers.

Figure 4:
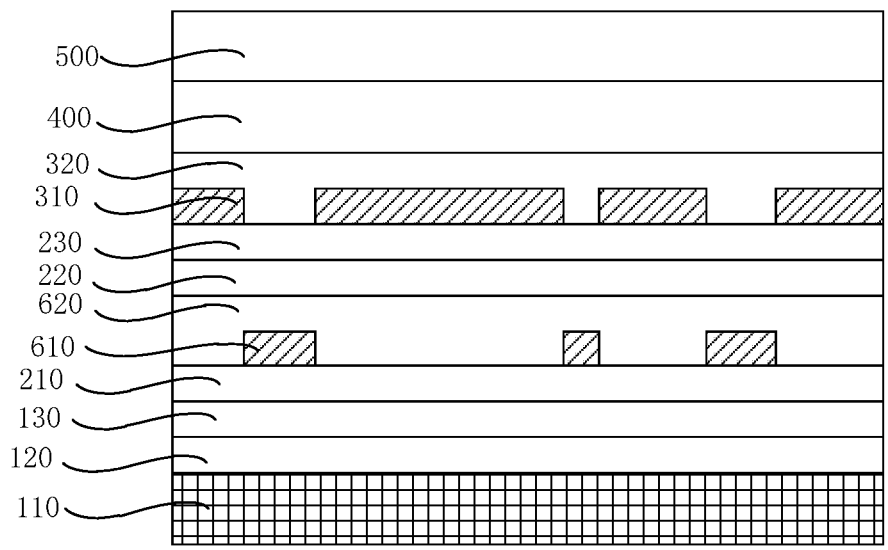
FIG. 4 is a structural diagram of a display panel according to yet another embodiment of the present application, with a compensation layer being provided within an insulation layer.

FIG. 4 is a structural diagram of a display panel according to yet another embodiment of the present application; please refer to FIG. 4. The display panel according to this embodiment includes a substrate 100, an insulation layer 200, a conductive layer 310, a first planarization layer 320, an OLED layer 400 and an encapsulation layer 500 which are sequentially stacked. A plurality of first grooves are formed in the conductive layer 310, and the first planarization layer 320 fills the first grooves and covers the conductive layer 310.

A compensation layer 610 is further included, a plurality of second grooves are formed in the compensation layer 610, and the projection of the compensation layer 610 on the substrate 100 at least overlaps with the projection of part of the first grooves on the substrate 100.

This embodiment is different from the above embodiments in that the compensation layer 610 in this embodiment is provided in the insulation layer 200. As shown in FIG. 4, the compensation layer 610 in this embodiment is provided between a gate insulation layer 210 and a capacitor insulation layer 220 within the insulation layer 200. Since the compensation layer 610 and the conductive layer 310 are still provided on the same side of the under-screen camera, that is, on the same light propagation path, this embodiment may also achieve the purpose in the above embodiments of reducing the diffraction phenomenon of light and improving the imaging quality.

It should be noted that this embodiment only shows the solution in which the compensation layer 610 is located between the gate insulation layer 210 and the capacitor insulation layer 220. It is clear for those skilled in the art that, in other optional implementations, the compensation layer 610 may also be provided between the capacitor insulation layer 220 and an interlayer dielectric layer 230, this arrangement manner still being able to achieve the same effects.

Optionally, in this embodiment, a second planarization layer 620 may be further provided on the compensation layer 610, so that a surface of the compensation layer 610 is flatter, which facilitates the fabrication of subsequent layers.

Figure 5:
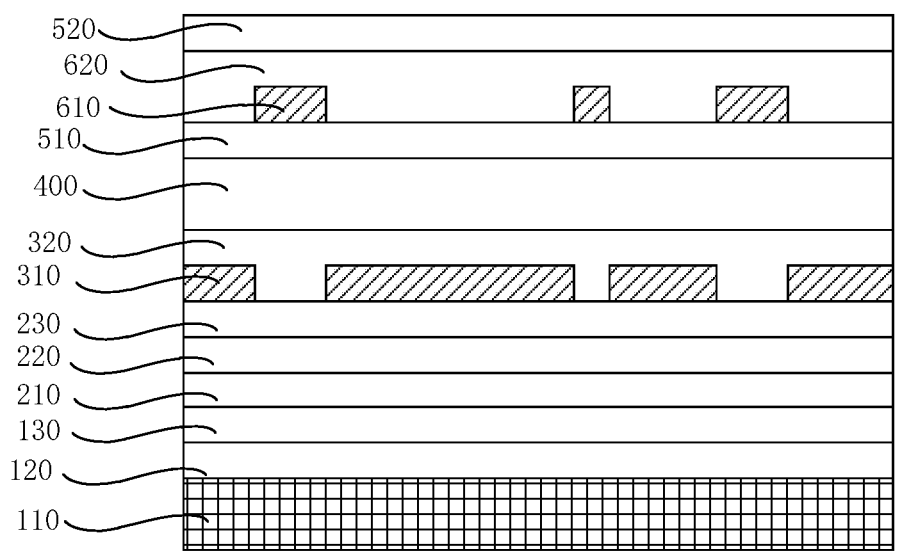
FIG. 5 is a structural diagram of a display panel according to still another embodiment of the present application, with a compensation layer being provided within an encapsulation layer.

FIG. 5 is a structural diagram of a display panel according to still another embodiment of the present application; please refer to FIG. 5. The display panel according to this embodiment includes a substrate 100, an insulation layer 200, a conductive layer 310, a first planarization layer 320, an OLED layer 400 and an encapsulation layer 500 which are sequentially stacked. A plurality of first grooves are formed in the conductive layer 310, and the first planarization layer 320 fills the first grooves and covers the conductive layer 310.

A compensation layer 610 is further included, a plurality of second grooves are formed in the compensation layer 610, and the projection of the compensation layer 610 on the substrate 100 at least overlaps with the projection of part of the first grooves on the substrate 100.

This embodiment is different from the above embodiments in that the compensation layer 610 in this embodiment is provided in the encapsulation layer 500. As shown in FIG. 5, the encapsulation layer 500 in this embodiment may be for example an flexible encapsulation layer, the encapsulation layer 500 includes a first encapsulating insulation layer 510 and a second encapsulating insulation layer 520, and the compensation layer 610 is provided between the first encapsulating insulation layer 510 and the second encapsulating insulation layer 520. Since the compensation layer 610 and the conductive layer 310 are still provided on the same side of the under-screen camera, that is, on the same light propagation path, this embodiment may also achieve the purpose in the above embodiments of reducing the diffraction phenomenon of light and improving the imaging quality.

Optionally, in this embodiment, a second planarization layer 620 may be further provided on the compensation layer 610, so that a surface of the compensation layer 610 is flatter, which facilitates the fabrication of subsequent layers.

Figure 6:
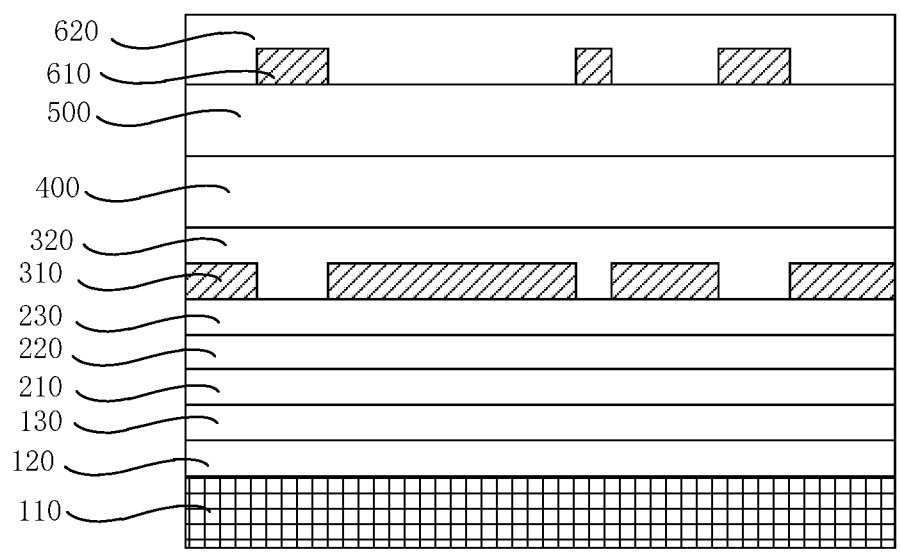
FIG. 6 is a structural diagram of a display panel according to still another embodiment of the present application, with a compensation layer being detachably provided above an encapsulation layer.

FIG. 6 is a structural diagram of a display panel according to still another embodiment of the present application; please refer to FIG. 6. The display panel according to this embodiment includes a substrate 100, an insulation layer 200, a conductive layer 310, a first planarization layer 320, an OLED layer 400 and an encapsulation layer 500 which are sequentially stacked. A plurality of first grooves are formed in the conductive layer 310, and the first planarization layer 320 fills the first grooves and covers the conductive layer 310.

A compensation layer 610 is further included, a plurality of second grooves are formed in the compensation layer 610, and the projection of the compensation layer 610 on the substrate 100 at least overlaps with the projection of part of the first grooves on the substrate 100.

This embodiment is different from the above embodiments in that the compensation layer 610 in this embodiment is detachably provided on the encapsulation layer 500, and the compensation layer 610 may be fixed to the encapsulation layer by means of adhesion.

In this embodiment, the compensation layer 610 may be a layer which is independently manufactured. That is, the compensation layer 610 may be manufactured separately from other layers of the display panel, thereby reducing the influence on other layers of the display panel when the compensation layer 610 is manufactured, and facilitating to improve the production efficiency.

Since the compensation layer 610 and the conductive layer 310 are still provided on the same side of the under-screen camera, that is, on the same light propagation path, this embodiment may also achieve the purpose in the above embodiments of reducing the diffraction phenomenon of light and improving the imaging quality.

By detachably providing the compensation layer 610 on the encapsulation layer 500, it may be convenient for the replacement and detachment of the compensation layer 610, and facilitate to adjust the parameters such as the thickness of the compensation layer 610 according to the actual situation, so as to better reduce the occurrence of the diffraction phenomenon.

Optionally, in this embodiment, a second planarization layer 620 may be further provided on the compensation layer 610, so that a surface of the compensation layer 610 is flatter, which facilitates the fabrication of subsequent layers.

This embodiment provides a display device, including the display panel described in any one of the above embodiments.

The display device according to an embodiment of the present application includes a housing, multiple electronic devices are provided in the housing, an opening is provided on one side of the housing, and the display panel is attached to the opening.

Since the compensation layer is provided in the display panel, this embodiment may reduce the probability of the diffraction of light passing through the display panel, thereby facilitating to improve the imaging quality of the under-screen camera.

This embodiment further provides a manufacturing method of a display panel, specifically including: providing a substrate 100;

forming an insulation layer 200 on the substrate in a stacked manner;

forming a conductive layer 310 on the insulation layer in a stacked manner, and patterning the conductive layer 310 to form a plurality of first grooves;

forming a first planarization layer 320 on the patterned conductive layer 310 in a stacked manner;

forming an OLED layer 400 and an encapsulation layer 500 on the first planarization layer 320 in a stacked manner; and forming a compensation layer 610 between the insulation layer 200 and the conductive layer 310, or forming the compensation layer 610 between the first planarization layer 320 and the OLED layer 400; and patterning the compensation layer 610 to form a plurality of second grooves, the projection of the compensation layer 610 on the substrate 100 at least overlapping with the projection of part of the first grooves on the substrate 100.

In some embodiments, the compensation layer 610 with the second grooves may be formed through processes of exposure, development, etching, etc.

The display device fabricated by the manufacturing method of this embodiment may reduce or eliminate the probability of the diffraction of light passing through the display panel, thereby being good for improving the imaging quality of the under-screen camera.

This embodiment further provides a manufacturing method of a display panel, specifically including: providing a substrate 100;

forming an insulation layer 200 on the substrate in a stacked manner;

forming a conductive layer 310 on the insulation layer in a stacked manner, and patterning the conductive layer 310 to form a plurality of first grooves;

forming a first planarization layer 320 on the patterned conductive layer 310 in a stacked manner;

forming an OLED layer 400 and an encapsulation layer 500 on the first planarization layer 320 in a stacked manner; and forming a compensation layer 610 in the substrate 100, the insulation layer 200 or the encapsulation layer 500; and patterning the compensation layer 610 to form a plurality of second grooves, the projection of the compensation layer 610 on the substrate 100 at least shading the projection of part of the first grooves on the substrate 100.

In one feasible implementation, the compensation layer 610 with the second grooves may be formed through processes of exposure, development, etching, etc.

The display device fabricated by the manufacturing method of this embodiment may reduce the probability of the diffraction of light passing through the display panel, thereby being good for improving the imaging quality of the under-screen camera etc.

Finally, it should be noted that the foregoing embodiments are merely intended for describing the technical solutions of the present application other than limiting the present application. Although the present application is described in detail with reference to the foregoing embodiments, persons of ordinary skill in the art should understand that they may still make modifications to the technical solutions described in the foregoing embodiments or make equivalent substitutions to part or all of the technical features therein; and these modifications or substitutions do not make the essence of corresponding technical solutions depart from the scope of the technical solutions of embodiments of the present application.

What is claimed is:

1. A display panel, comprising: a substrate, an insulation layer, a conductive layer, a first planarization layer, an OLED layer and an encapsulation layer which are stacked in sequence, wherein a plurality of first grooves are formed in the conductive layer, and the first planarization layer fills the first grooves and covers the conductive layer; and the display panel further comprising a compensation layer, wherein a plurality of second grooves are formed in the compensation layer, and a projection of the compensation layer on the substrate at least overlaps with projection of part of the first grooves on the substrate.

2. The display panel according to claim 1, wherein the projection of the compensation layer on the substrate coincides with the projection of the first grooves on the substrate.

3. The display panel according to claim 2, wherein the compensation layer and the conductive layer are made of different materials, and the compensation layer comprises a first compensation layer and a second compensation layer which are stacked in sequence, the first compensation layer being configured to compensate an amplitude, and the second compensation layer being configured to compensate a phase.

4. The display panel according to claim 2, wherein the first compensation layer is a multilayer formed in a stacked manner.

5. The display panel according to claim 1, wherein the compensation layer and the conductive layer are made of same material.

6. The display panel according to claim 1, wherein the compensation layer has a thickness equal to a thickness of the conductive layer.

7. The display panel according to claim 1, wherein the compensation layer comprises a silicon oxide layer, a silicon nitride layer, a silicon oxynitride layer, a single crystal silicon layer or an indium tin oxide layer.

8. The display panel according to claim 1, wherein the compensation layer is provided between the insulation layer and the conductive layer; or the compensation layer is provided between the first planarization layer and the OLED layer.

9. The display panel according to claim 1, wherein the compensation layer is provided in the substrate, the insulation layer or the encapsulation layer.

10. The display panel according to claim 1, wherein the substrate is a multilayer formed in a stacked manner, and the compensation layer is provided between any two adjacent layers of the substrate.

11. The display panel according to claim 1, wherein the insulation layer is a multilayer formed in a stacked manner, and the compensation layer is provided between any two adjacent layers of the insulation layer.

12. The display panel according to claim 1, wherein the encapsulation layer is a multilayer formed in a stacked manner, and the compensation layer is provided between any two adjacent layers of the encapsulation layer.

13. The display panel according to claim 1, wherein the substrate comprises a base, a first substrate insulation layer and a second substrate insulation layer, the compensation layer is provided between the first substrate insulation layer and the second substrate insulation layer, or the compensation layer is provided between the first substrate insulation layer and the base.

14. The display panel according to claim 1, wherein the insulation layer comprises a gate insulation layer, a capacitor insulation layer and an interlayer dielectric layer, the compensation layer is provided between the gate insulation layer and the capacitor insulation layer, or the compensation layer is provided between the capacitor insulation layer and the interlayer dielectric layer.

15. The display panel according to claim 1, wherein the encapsulation layer comprises a first encapsulating insulation layer and a second encapsulating insulation layer, and the compensation layer is provided between the first encapsulating insulation layer and the second encapsulating insulation layer.

16. The display panel according to claim 1, wherein the compensation layer is detachably provided on the encapsulation layer.

17. The display panel according to claim 1, further comprising a second planarization layer, wherein the second planarization layer fills the second grooves and covers the compensation layer.

18. A display device comprising the display panel according to claim 1.

* * * * *